United States Patent [19]
Phillips

[11] 4,097,717
[45] Jun. 27, 1978

[54] WATER BED MATTRESS WITH REGULATED HEATING MEANS THEREFOR AND CONTROLLING THE HEAT LOSS THEREFROM AND THE METHOD OF MAKING THE SAME

[76] Inventor: Raymond M. Phillips, 2566 Tuna Canyon Rd., Malibu, Calif. 90265

[21] Appl. No.: 686,885

[22] Filed: May 17, 1976

[51] Int. Cl.² .............................................. H05B 1/00
[52] U.S. Cl. ...................................... 219/217; 5/366; 128/376; 219/313
[58] Field of Search .................... 219/217, 313; 5/366, 5/370; 29/611; 128/376

[56] References Cited

U.S. PATENT DOCUMENTS

| | | | |
|---|---|---|---|
| 3,585,356 | 6/1971 | Hall | 219/313 X |
| 3,736,604 | 6/1973 | Carson, Jr. | 5/366 |
| 3,746,835 | 7/1973 | Yu et al. | 219/217 |
| 3,778,852 | 12/1973 | Penn et al. | 5/366 X |

*Primary Examiner*—C. L. Albritton
*Attorney, Agent, or Firm*—Robert J. Schaap

[57] ABSTRACT

A water bed mattress with means for heating the same and with means for controlling heat losses therefrom. In one embodiment of the invention, the water bed mattress comprises a pair of upper and lower sheets connected by a peripheral side wall to form a water chamber therein. An electrically energizable heating element is located adjacent one of the sheets and is enclosed by a piece of plastic forming a heat-generating chamber therein. An electrical cord extends outwardly from this heat-generating chamber for ultimate connection to a source of electrical power. The actual electrically energizable heating means may adopt a variety of forms including a coil located in the heat generating chamber, or otherwise a strip heater or similar forms of heating elements. A heat sensor may be located within the water chamber and is connected to a feedback controller which is in turn connected through a temperature regulator, such as a variostat, to the heating means. In this way, constant temperature is maintained in the water within the water chamber. The present invention also provides various embodiments with means for reducing heat loss from the water chamber including a heat insulating strip over the upper surface of the water bed mattress. In other embodiments, the water bed mattress is actually formed of a rigid chamber-forming member with a relatively flexible plastic sheet disposed across the chamber-forming member. In each of these cases, heating means are also provided for heating the water in the water chamber. In several embodiments of the present invention, the electrically energizable heater is included within a liner disposed around the water bed mattress.

37 Claims, 34 Drawing Figures

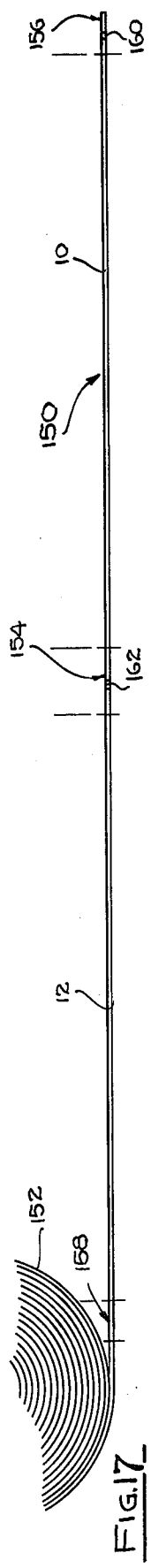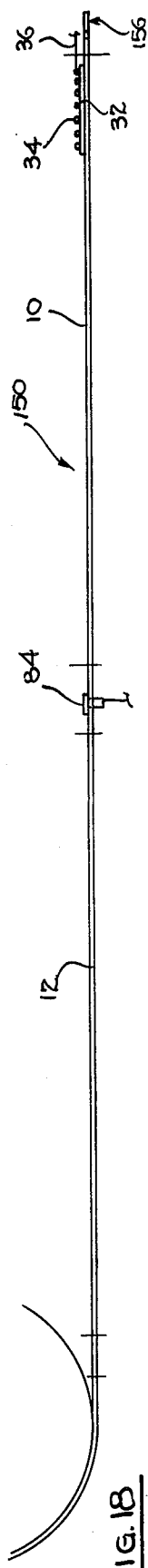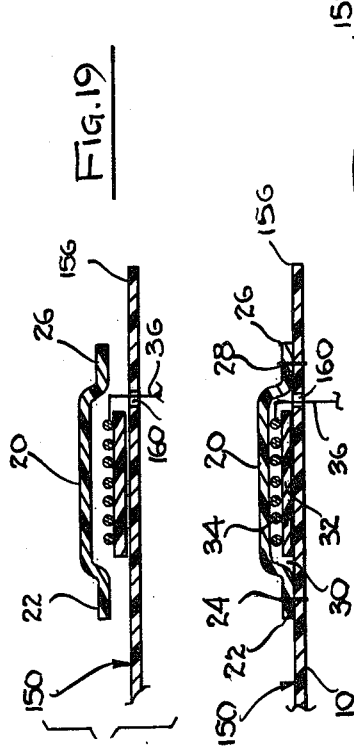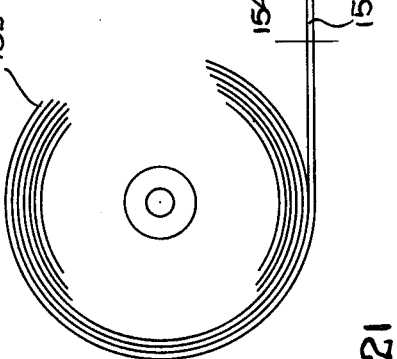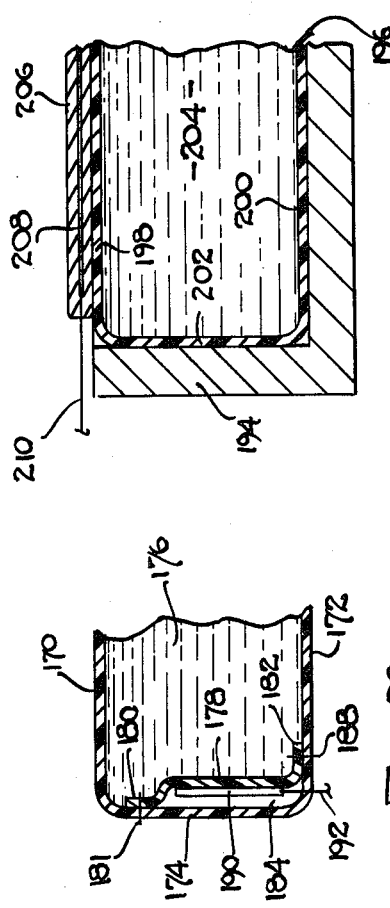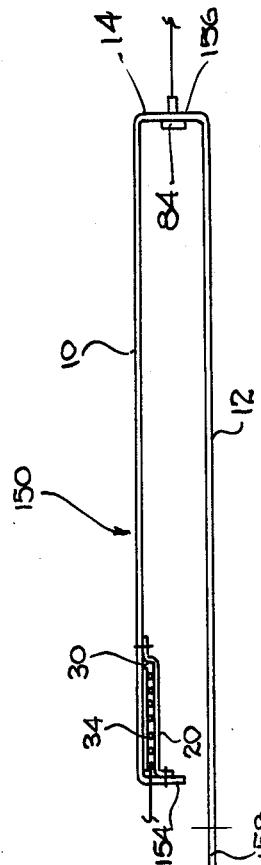

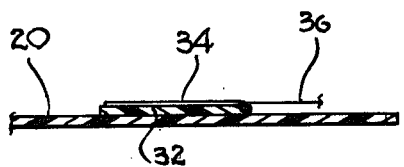
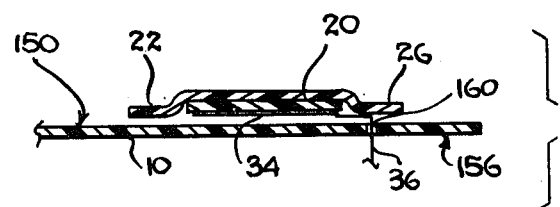
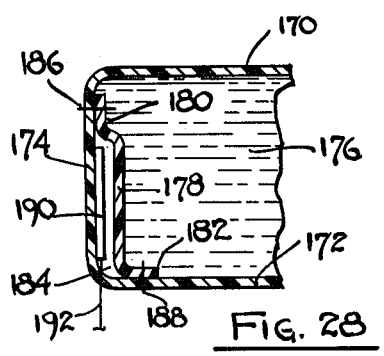
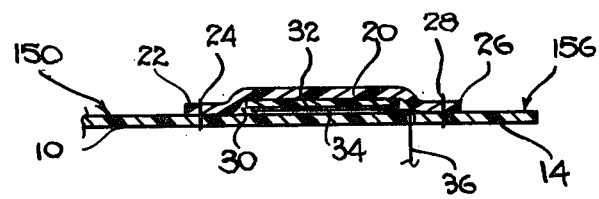
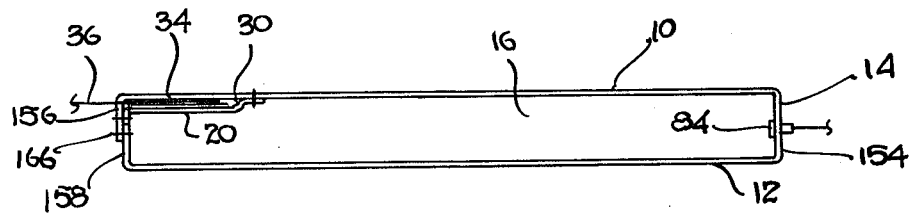
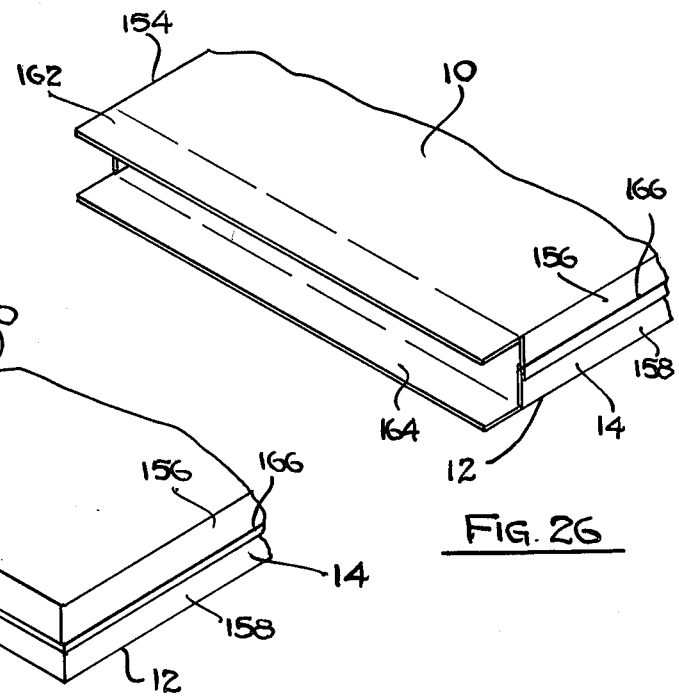

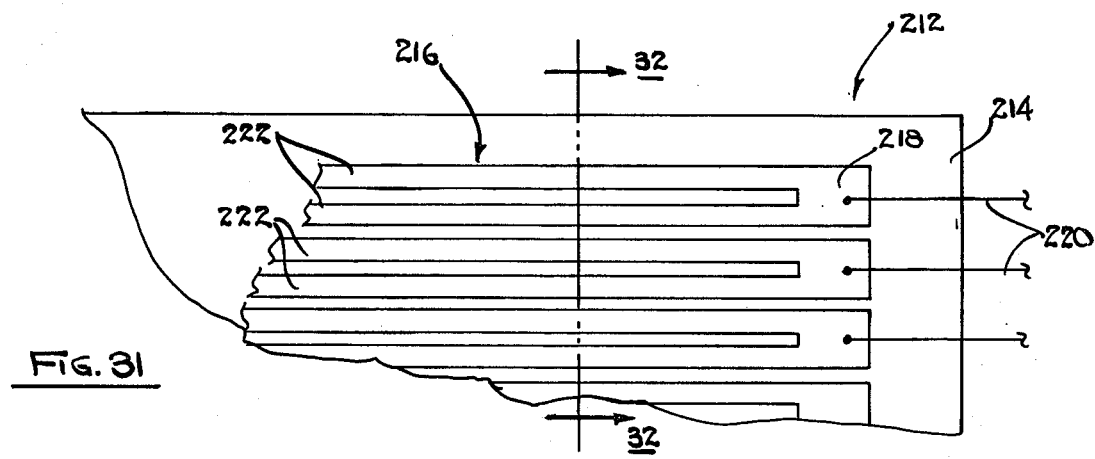
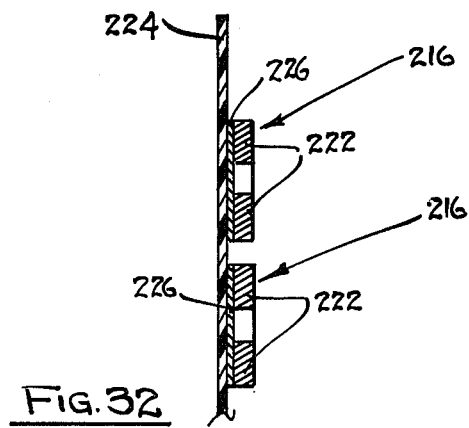
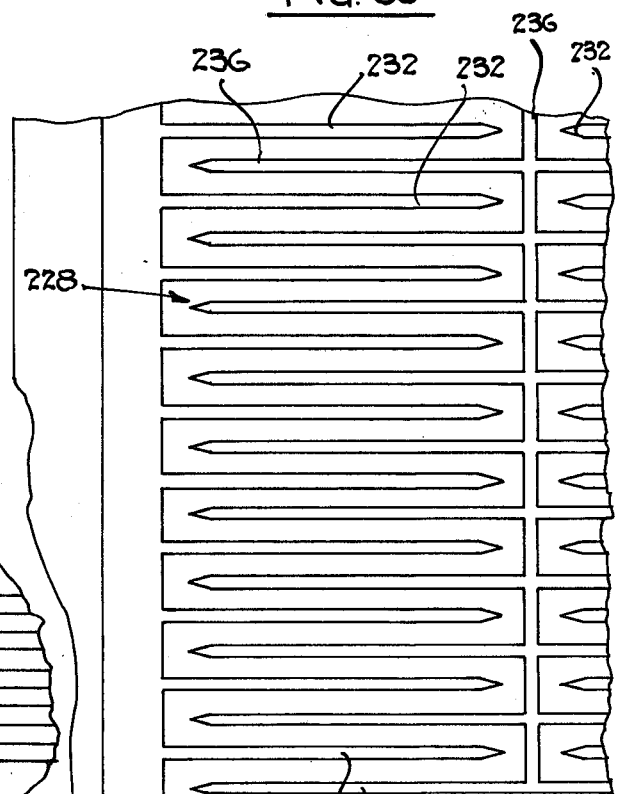
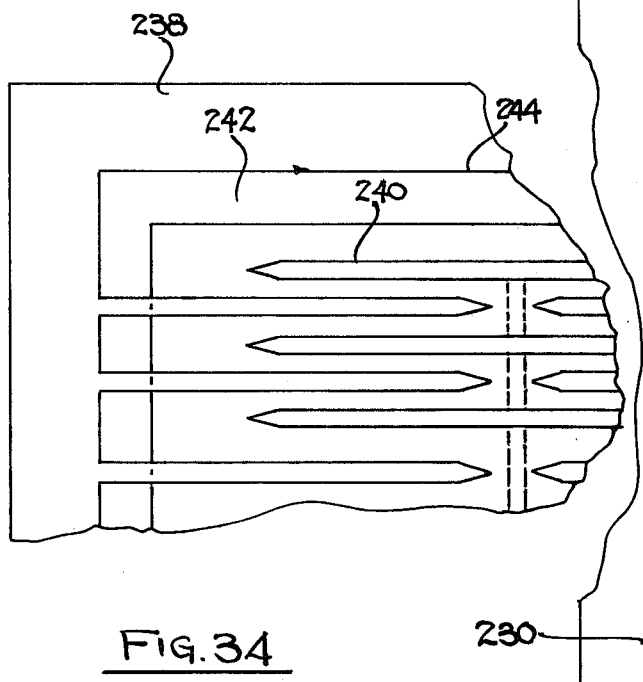
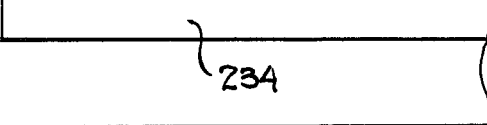

WATER BED MATTRESS WITH REGULATED HEATING MEANS THEREFOR AND CONTROLLING THE HEAT LOSS THEREFROM AND THE METHOD OF MAKING THE SAME

BACKGROUND OF THE INVENTION

This invention relates in general to certain new and useful improvements in water bed mattresses, and, more particularly, to water bed mattresses which have controlled heating means therefor and means for reducing heat losses therefrom.

In recent years, water beds have become widely commercially acceptable and have found substantially increased use. It is now fairly well recognized that water beds, that is those forms of beds which employ a water-filled mattress, have not only enjoyment value, but thereapeutic value as well. In general, it has been found that many people find that it is not only more enjoyable, but more restful, to sleep on a water bed mattress than other forms of conventional mattresses filled with solid, but nevertheless resilient, material.

The present commercially available water bed mattresses generally comprise a rectangular shell formed primarily of some form of a fairly flexible and foldable plastic material which forms an internal water chamber and which is filled with water. This form of water bed mattress is thereupon supported in and by virtue of its construction and is required to be supported in a rigid frame. In recent years, there have been various other forms of water bed mattresses which utilize some form of air cylinder, either included in the water bed mattress or surrounding the water bed mattress, but which is nevertheless an integral part of the water bed mattress. These air frame water bed mattresses differ from the water bed mattresses without the air bladder in that the air frame water bed mattresses do not require the employment of a rigid structural frame.

In each form of the aforementioned water bed mattresses, some form of heating means is required to heat the water, generally to a temperature of about 85° to about 105° F, depending upon the ultimate user of the water bed mattress. It can be understood that since water is an excellent conductor of heat, the person lying on the water bed mattress with a water temperature substantially below body temperature, as for example a water bed mattress with a water temperature of 70° F, can withdraw body heat from the party lying on the mattress. Consequently, it has been well recognized that some form of heating means is required to heat the water within the water bed mattress; at least to within a temperature range somewhat approximating the temperaturerange of the human body.

In order to provide the necessary heating means for water bed mattresses, there have been several commercially available water bed heaters, which generally include a pad disposed beneath the water bed mattress and in contact therewith, and which pad is connected through a rheostat or similar temperature control device and which is ultimately connected to a source of electrical power. However, these water bed mattress heaters can be potentially dangerous in that the heater pad must be relatively flat when disposed beneath the water bed mattress. However, after the water bed mattress is disposed upon the heater pad and filled with water, the water bed heater pad could actually be folded slightly, and in which case, the heater pad develops localized hot spots. After the mattress is disposed upon the heater pad and filled with water, it is virtually impossible, due to the weight of the water bed mattress, to determine whether the heater pad is lying in a relatively flat position. In the event that the heating pad is not relatively flat and the localized hot spots are generated, the plasticizers harden within the plastic material forming the water bed mattress, resulting in cracks. Consequently, the water bed mattress begins to develop water leakage, which not only results in substantial damage to the surrounding environment, but also results in a potential fire risk, if not electricution to the individual residing on the water bed mattress.

Another one of the problems residing in the use of the conventional water bed heating pad is that there is no effective means for temperature control. Typically, such water bed mattress heater pads were provided with a rheostat or other voltage or current regulating type of device which regulated the amount of electrical power to the heating pad and, hence, the amount of heat applied to the water in the water chamber of the mattress. Nevertheless, it was incumbent upon the user to carefully adjust the temperature control for several days after initially using the heater pad in order to assure that neither too much heat, nor otherwise too little heat, was applied to the water in the water bed mattress. Even moreso, when the user of the water bed mattress desired to slightly alter the temperature, there was no assurance that a slight change of the electrical energy control device, such as the rheostat, would provide the proper amount of current to the heater pad, and hence the proper amount of heat to the water in the water bed mattress.

In order to overcome this problem, there has been at least one proposal for providing a heater to be used with the water bed mattress and which is more fully described in U.S. Pat. No. 3,585,356 to Charles Hall. However, this form of heating mechanism also suffered from several deficiencies in that there was no feedback control to assure that proper temperature had been maintained in the water contained within the water bed mattress. Moreover, as can be observed, it was necessary to provide various forms of insulation of the heater from the material forming the water bed mattress so as to avoid destruction of the water bed mattress per se. In addition, since the heater was disposed across substantially the entire surface area of one sheet of the mattress, the heat applied to the water did not account for greater heat loss at the peripheral portions of the mattress than in the interior portions thereof. Accordingly, this form of heating mechanism was not highly effective.

Another problem with the commercially available water bed mattresses is that since the water temperature is substantially higher than the surrounding environment, which is typically at room temperature of approximately 70° F, there is a substantial heat loss from the water bed mattress, unless the water bed mattress is completely covered at all times. Heretofore, there has been no commercially available technique for reducing the heat loss from water bed mattresses. In times of energy shortage and with the resultant rise in the cost of electrical energy, this factor has militated against the use of water bed mattresses.

OBJECTS OF THE INVENTION

It is, therefore, the primary object of the present invention to provide a water bed mattress construction which includes an internal water chamber having a surface across the upper portion of the mattress which is capable of supporting an individual, and which includes a heating means for heating the water to a temperature reasonably compatible to a human individual without the attendant danger of generating localized hot spots in the mattress.

It is another object of the present invention to provide a water bed mattress construction of the type stated which includes a feedback temperature control system for carefully controlling the temperature of the water.

It is a further object of the present invention to provide a water bed mattress construction of the type stated which is provided with a rigid frame for reducing the potential danger and hazard of water leakage.

It is also an object of the present invention to provide a water bed mattress of the type stated which includes a means for reducing the heat loss from the water bed mattress.

It is another salient object of the present invention to provide a water bed mattress of the type stated which is highly efficient in its operation and has a relatively long useful life and which can be made at a relatively low cost.

It is an additional object of the present invention to provide a method of making a water bed construction on a highly efficient basis at a relatively low cost.

With the above and other objects in view, my invention resides in the novel features of form, construction, arrangement and combination of parts presently described and pointed out in the claims.

GENERAL DESCRIPTION

In general, the water bed mattress constructions of the present invention exist in several embodiments, and all of which are similar in construction. In one form, the water bed mattress is provided with a regulating heating means. This mattress includes an upper and lower sheet surrounded by a peripheral wall to form a water chamber. A sealing means formed of an electrically insulative heat conductive material is located in adjacent relationship to the periphery of one of the upper or lower sheets and forms a heat-generating chamber with respect to one of these sheets. An electrically energizable heating means is located in the heat generating chamber and is capable of generating heat conductively passed through the sealing means into the water contained in the water chamber. In addition, a connector means is provided for connection of the heat generating chamber to a source of electrical power. A control means is operatively associated with the connector means for regulating the heat applied by the heating means.

In a preferred aspect of the invention, a temperature setting means, as for example, a rheostat, is provided for setting the desired temperature of the water in the water chamber. A sensing means, such as a temperature sensor, is located in the water chamber for sensing the temperature of the water in this chamber. A controller means is connected in feedback relation between the temperature setting means and the sensing means to create a closed circuit loop to automatically regulate the amount of heat applied to the water in accordance with the temperature sensing means. The controller means would normally be provided with electrical conductors for connection to a source of electrical current.

In another embodiment of the present invention, a water bed mattress is provided with a rigid frame which surrounds the lower sheet and a peripheral wall which provides heat insulative qualities to aid in the prevention of heat loss from the water in the water chamber. A heat insulative member is disposed across and secured to the upper sheet so as to enclose the water chamber and also aid in the prevention of heat loss from the water in the water chamber. This heat insulative member can adopt various forms, such as a flat plate collector type heat insulator, or otherwise a relatively thick plastic type material. In like manner, this form of water bed construction could also be provided with the regulating heat means as previously described.

Another form of water bed construction also relies upon the use of the rigid frame except that the mattress itself is not disposed within the frame or even secured to the frame. In this case, a flexible foldable plastic sheet is disposed across the top surface and secured to the frame. A means is provided for rigidly securing the upper sheet to a frame so that a party lying on the upper sheet is supported by the supper sheet and the water in the interior water chamber. In a preferred aspect of the invention, the means for securing the sheet includes at least mechanical means. This form of water bed mattress may also be provided with the regulating heating means, as described above.

In addition, the present invention also provides embodiments utilizing a rigid frame which also serves as heat insulating members. In this case, the frame may include the recess for receiving a heat generating element exteriorly of the water chamber, but which is in close proximity to the water chamber. In addition, in another embodiment, a linear could be interposed between the rigid and the water bed mattress with the heat applied to the water chamber through a heating means in the liner.

The present invention also provides a unique method of making the water bed mattresses. This method is also based upon the construction of the water bed mattresses and provides a most efficient means for producing the mattress with the required heating means and/or the heat insulative members associated therewith.

BRIEF DESCRIPTION OF THE DRAWINGS

Figure 1:
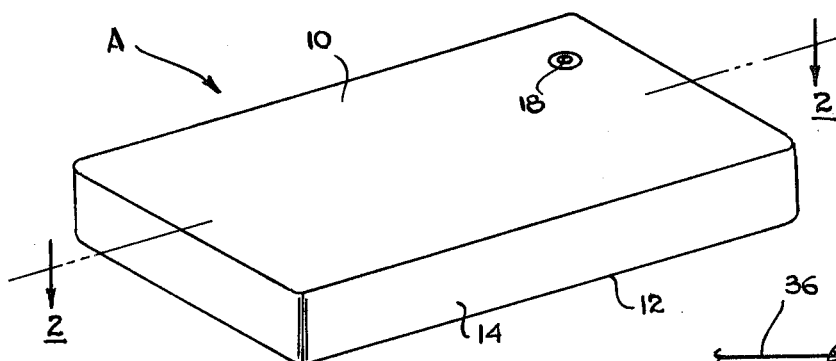
Figure 3:
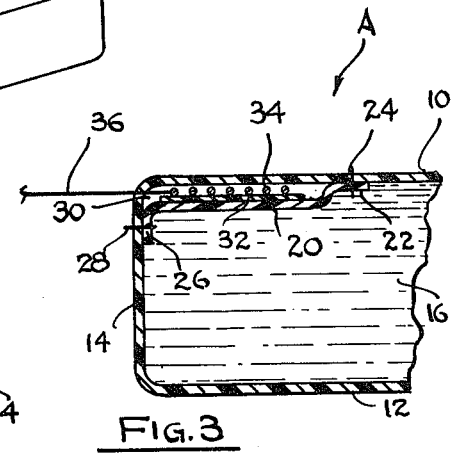
Figure 2:
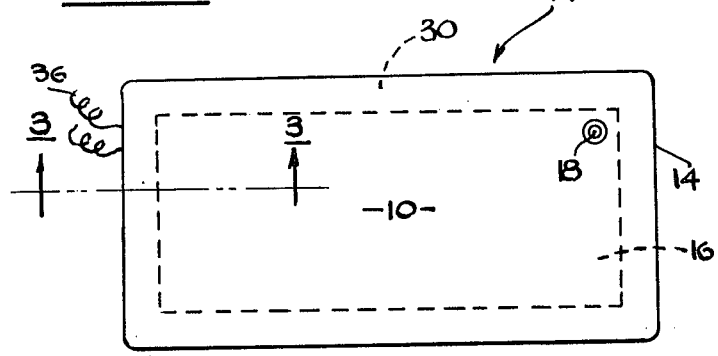
Figure 4:
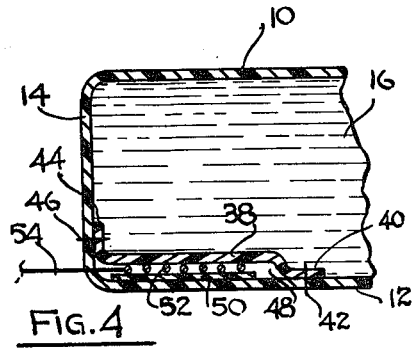
Figure 5:
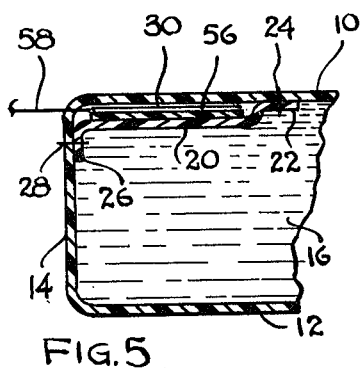
Figure 6:
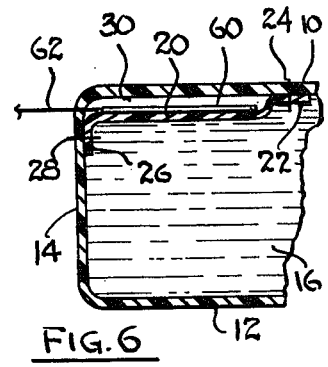
Figure 7:
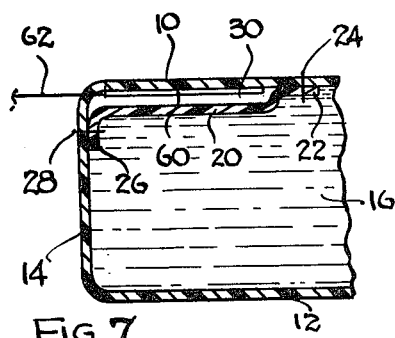
Figure 9:
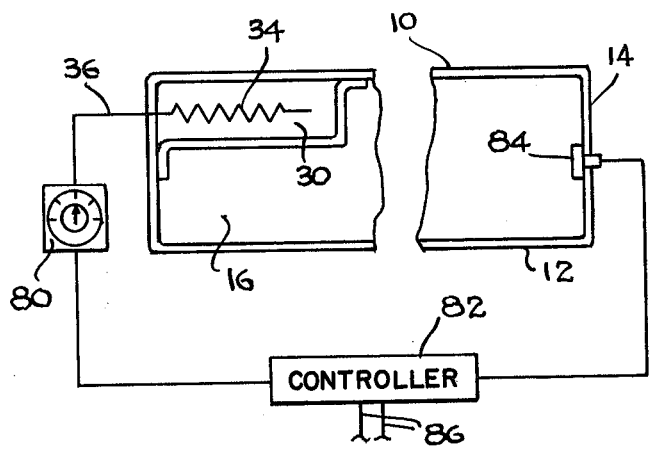
Figure 8:
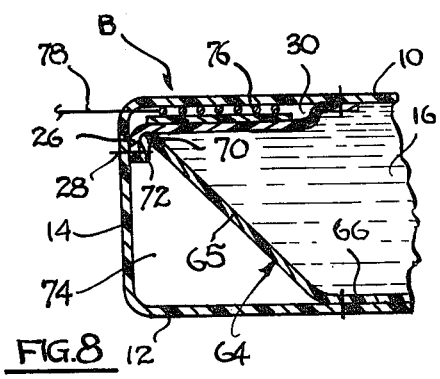
Figure 10:
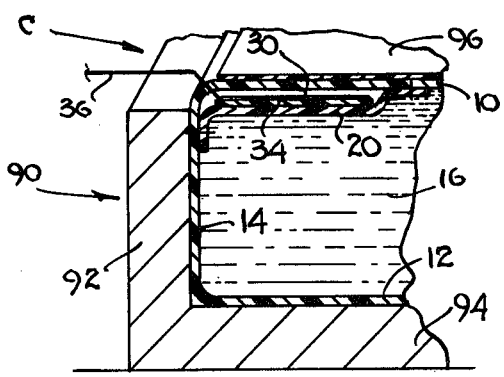
Figure 11:
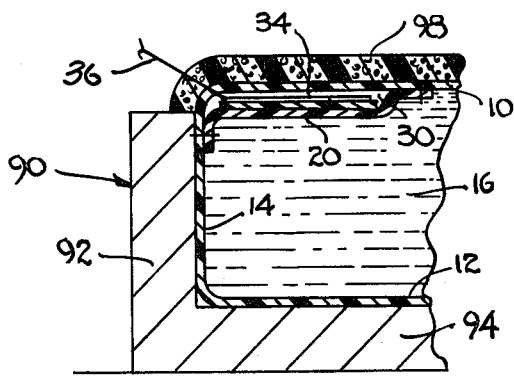
Figure 12:
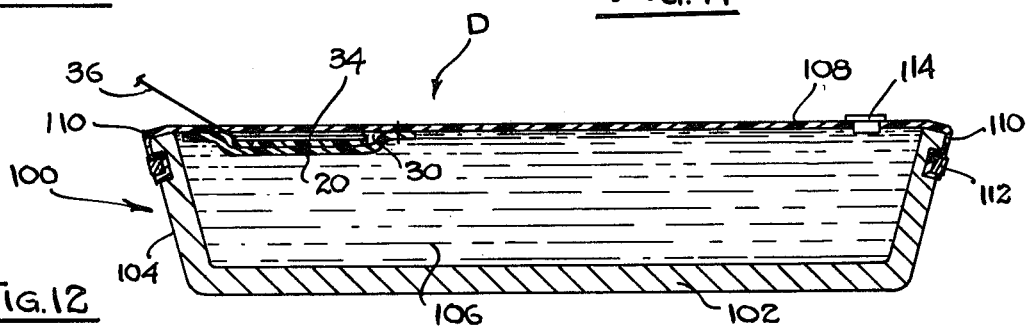
Figure 13:
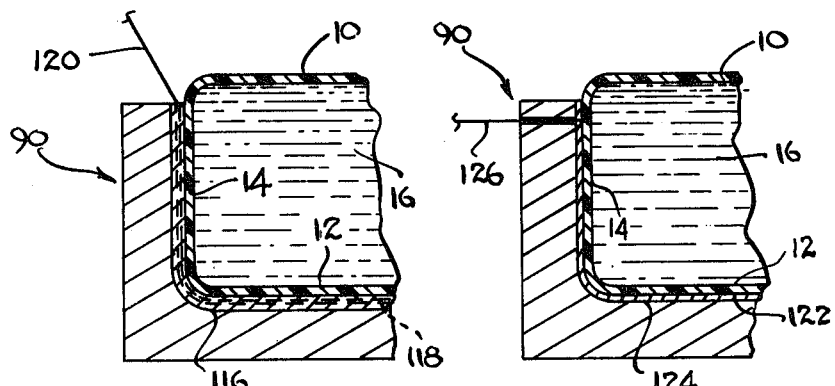
Figure 14:
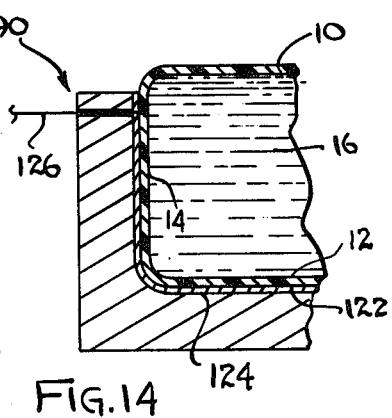
Figure 15:
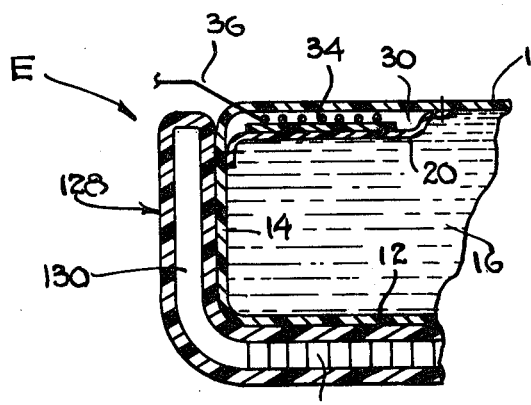
Figure 16:
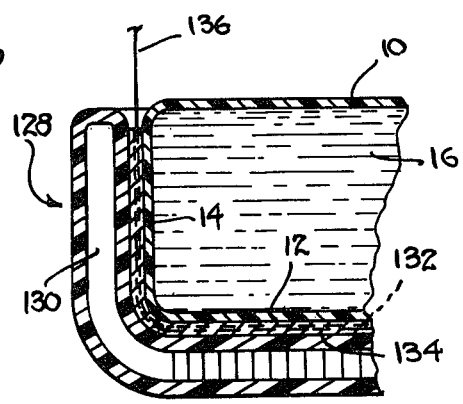

Having thus described the invention in general terms, reference will now be made to the accompanying drawings in which:

FIG. 1 is a perspective view of a water bed mattress with internal heating means constructed in accordance with and embodying the present invention;

FIG. 2 is a horizontal sectional view taken along line 2—2 of FIG. 1;

FIG. 3 is a fragmentary vertical sectional view taken along line 3—3 of FIG. 2;

FIG. 4 is a fragmentary vertical sectional view, similar to FIG. 3, and showing a modified form of water bed mattress constructed in accordance with the present invention;

FIG. 5 is a fragmentary vertical sectional view, similar to FIG. 3, and showing another form of modified water bed mattress construction in accordance with the present invention;

FIG. 6 is a fragmentary vertical sectional view, similar to FIG. 3, and showing still another modified form of water bed mattress construction in accordance with the present invention;

FIG. 7 is a fragmentary vertical sectional view, similar to FIG. 3, and showing still a further modified form of water bed mattress construction in accordance with the present invention;

FIG. 8 is a fragmentary vertical sectional view, similar to FIG. 3, and showing yet another modified form of water bed mattress construction in accordance with the present invention;

FIG. 9 is a schematic view showing a feedback control system for controlling the heat applied to the water in the water bed mattresses of the present invention;

FIG. 10 is a fragmentary perspective view showing a water bed mattress which includes a heat insulative cover as part thereof;

FIG. 11 is a fragmentary vertical sectional view, somewhat similar to FIG. 10, and showing a modified form of water bed mattress with a modified form of heat insulative cover as a part thereof;

FIG. 12 is a vertical sectional view of a water bed mattress construction which utilizes a rigid base frame and a flexible top sheet;

FIG. 13 is a fragmentary vertical sectional view, somewhat similar to FIG. 3, and showing a water bed mattress construction with a heater mechanism included within a liner surrounding the water bed mattress;

FIG. 14 is a fragmentary vertical sectional view, somewhat similar to FIG. 13, and showing a modified form of water bed mattress with heater construction therefor;

FIG. 15 is a fragmentary vertical sectional view, similar to FIG. 13, and showing a water bed mattress construction with an internally included heating means and a rigid heat-insulating frame included therewith;

FIG. 16 is a fragmentary vertical sectional view, similar to FIG. 15, and showing a modified form of water bed mattress with a liner having a heater means and included with a rigid heat insulative support frame;

FIG. 17 is a schematic side-elevational view showing the first step in the manufacture of a water bed mattress construction of the type illustrated in FIG. 1 of the drawings;

FIG. 18 is a schematic side-elevational view showing the attachment of a heating means to a portion of an initial sheet of plastic material;

FIG. 19 is a fragmentary schematic side-elevational view, showing the arrangement of a sealing strip with respect to the heating means;

FIG. 20 is a fragmentary schematic side-elevational view, similar to FIG. 19, and showing the attachment of the sealing strip to form a heat-generating chamber;

FIG. 21 is a schematic side elevational view, showing the folding of a portion of the plastic material of the initial sheet of material;

FIG. 22 is a schematic fragmentary side elevational view showing a slightly modified form of securing the heating means to the sealing strip;

FIG. 23 is a schematic side-elevational view, similar to FIG. 22, and showing the disposition of the sealing strip to the initial sheet of plastic material;

FIG. 24 is a schematic fragmentary side elevational view, similar to FIG. 23, and showing the formation of a heat-generating chamber with the heating means of FIGS. 22 and 23;

FIG. 25 is a schematic side-elevational view showing the sealing of two end strips to form the envelope portion of the water bed mattress;

FIG. 26 is a fragmentary perspective view, showing the folding of longitudinal side flaps forming part of the mattress;

FIG. 27 is a fragmentary perspective view showing the sealing of the longitudinal side flaps to complete the water bed mattress;

FIG. 28 is a fragmentary vertical sectional view showing an additional modified form of water bed mattress constructed in accordance with and embodying the present invention, and in which a heater mechanism is located on one of the side walls forming part of the water bed mattress;

FIG. 29 is a fragmentary vertical sectional view, somewhat similar to FIG. 28, and showing a slightly alternate form of construction with the heating mechanism located in relationship to one of the peripheral side walls forming part of the water bed mattress;

FIG. 30 is a fragmentary vertical sectional view, somewhat similar to FIGS. 28 and 29, and showing a heater mechanism included within a covering pad disposed on the water bed mattress, and which in combination forms a heated water bed mattress system;

FIG. 31 is a fragmentary top-plan view showing a heater mechanism in the form of aluminum resistive heater strip arrangement secured to a substrate and which may be used in the water bed mattress construction of the present invention;

FIG. 32 is a vertical sectional view, taken along line 32—32 of FIG. 31;

FIG. 33 is a fragmentary top-plan view, similar to FIG. 31, and showing an alternate form of resistive heater strip arrangement which may be used as the heater mechanism of the present invention; and FIG. 34 is a fragmentary top-plan view, similar to FIG. 31, and showing yet another modified form of heater strip arrangement which may be used as a heating mechanism in the water bed mattresses of the present invention.

DETAILED DESCRIPTION

Referring now in more detail and by reference characters to the drawings which illustrate practical embodiments of the present invention, A designates a water bed mattress comprising an upper flexible plastic sheet 10 and a lower flexible plastic sheet 12, and both of which are substantially rectangular in their construction, but with rounded corner margins.

The upper and lower sheets 10 and 12 are both substantially of the same overall size and are marginally registered with each other. The upper and lower sheets are integrally connected by a peripherally extending generally rectangular side wall 14. It can be observed that the side peripheral wall 14 can be formed in a conventional manner by utilizing an integrally formed, downwardly struck flap on the top wall and an integrally formed, upwardly struck flap on the bottom wall which are heat sealed together. The upwardly struck and downwardly struck flaps on the lower and upper sheets, respectively, could be heat sealed by means of a lap seal, or otherwise these two flaps could be heat sealed by means of a butt seal if desired. The techniques for sealing the various components in the water bed mattress are conventional in their construction and are therefore neither described nor illustrated in any further detail herein.

With respect to the water bed mattress A, as well as the other water bed mattresses hereinafter described, these mattresses, and the components thereof, can be formed of any of a number of known plastic materials and include, for example, various forms of vinyl sheets, polyethylene, polystyrene, polybutadiene, copolymers thereof and the like. One of the preferred materials which is used in the water bed mattresses of the present invention are forms of polyvinylchloride. While the materials mentioned above are thermo-plastics in nature, it should be understood that many thermo-setting resins could also be used. In addition, various flexible non-plastic materials could also be employed, as for example various textile materials which are water impervious and which may be plastic impregnated, such as those cloth materials which are impregnated with a vinyl plastic material to render the same water impervious. The upper and lower sheets, as well as the peripheral side wall, should preferably have a thickness of about no less than 20 mils. However, the desired thickness may be predicated upon the overall size of the water bed mattress itself.

Returning again to FIGS. 1-3 of the drawings, it can be observed that the top sheet 10, the bottom sheet 12, and the peripheral side wall 14 form an internal water chamber 16 which, in this case, is illustrated as being filled with water. For this purpose, a water inlet valve 18, of conventional structure, is provided on the top sheet 10 in order to permit the introduction of water or the removal of water from the water chamber 16.

Referring now to FIG. 3, it can be observed that a peripherally extending chamber forming strip 20 surrounds the peripheral portion of the upper sheet 10 and is included with a horizontally disposed flange 22 which is heat sealed to the upper sheet 10 by means of heat seal 24. In like manner, the strip 20 is provided with a downwardly struck, annular flange 26 which is heat sealed to the peripheral wall 14 by means of a heat seal 28, and which thereby forms a heat-generating chamber 30 surrounding the peripheral portion of the upper sheet 10. The chamber-forming strip 20 may be formed of the same material used in the formation of the water bed mattress A, such as polyvinylchloride, although the chamber-forming strip 20 is preferably impregnated with a plasticizer resistant to heat so as to be capable of transmitting heat from the chamber 30 into the water chamber 16. In this case, the strip 20 will not deteriorate from the effects of heat by a heater included within the chamber 30, as hereinafter described, but will nevertheless be capable of conductively transmitting heat generated within the chamber 30 to the water contained within the water chamber 16.

Disposed within the heat-generating chamber 30 is a support strip 32 which carries a heating coil 34 and the latter of which is connected through a conductive electrical current carrying conductor 36 extending through the peripheral side wall 14 to a source of electrical current, in a manner to be hereinafter described in more detail. In this way, electrical energy is provided to the heating coil 34 which is preferably of an electrically resistive type heating coil for generation of heat. This heat is transmitted through the chamber forming strip 20 and to the water contained within the water chamber 16. However, it should be observed in this connection that the heating coil 34 itself is actually electrically insulated from the water within the chamber 16 by virtue of the chamber forming strip 20. Moreover the heat effects of the coil 34 do not deteriorate the chamber forming strip 20 since it is insulated by means of the support strip 32 and, moreover, since the chamber forming strip 20 is in contact with the water contained within the chamber 16.

In connection with the present invention, it has been found that it is only necessary to provide peripherally extending chamber, such as the chamber 30, in order to generate the heat for application through conductivity to the water within the chamber 16. In this respect, it is not necessary to employ a heating chamber across the entire flat surface of the upper sheet 10. In this way, it is possible to eliminate the deleterious effects which previously occurred with a relatively large heating pad.

The conductor 36 in this case is illustrated as being extended through the peripheral side wall 14, although the conductor 36 could actually be extended through the top sheet 10 or the bottom sheet 12. In any event, the conductor is extended through the sheets 10 or 12 or the peripheral side wall 14 into a grommet (not shown) or through an aperture which is snugly fitted around the conductor 36 so as to avoid water escapement from the chamber 16.

FIG. 4 illustrates a slightly modified form of water bed mattress which is similar to the water bed mattress illustrated in FIGS. 1-3, except that in this case the water bed mattress in FIG. 4 includes a bottom chamber forming member 38 which extends around the peripheral portion of the bottom wall 12 in proximity to the peripheral side wall 14. The bottom chamber forming strip 38 similarly includes a peripherally extending horizontal flange 40 which is heat sealed to the bottom wall 12 by a heat seal 42. In addition, the chamber forming strip 38 includes an upwardly struck, peripherally extending flange 44 which is heat sealed to the peripherally extending side wall 14 by means of a heat seal 46, and which thereby forms a heat generating chamber 48. Disposed within the heat generating chamber 44 is a heater mechanism similar to the heating mechanism used in FIG. 3, and includes a support strip 50 along with a heating coil 52 connected to a source of electrical energy by means of an electrical conductor 54. In this way, the electrical heating coil 52 is capable of generating heat for heat transfer through the chamber forming strip 38 to the water within the chamber 16. Moreover, the electrical conductor 54 is connected ultimately to a source of electrical energy as hereinafter described in more detail. It should also be observed in this respect that the heat generating chamber 48 extends peripherally around the bottom wall 12 in adjacent relationship to the peripheral side wall and does not necessarily extend across the entire portion of the bottom wall 12.

FIG. 5 represents a fragmentary vertical sectional view, somewhat similar to FIG. 3, and which illustrates another modified form of the water bed mattress constructed in accordance with FIG. 3. This latter water bed mattress includes the heat generating chamber 30 and, in this case, is provided with a strip heater 56 which is provided with an outwardly extending electrical conductor 58, similar to the conductor 36, for ultimate connection to a source of electrical energy. In this respect, the water bed mattress with the internally included heating mechanism of FIG. 5 operates in essentially the same manner as the water bed mattress of FIG. 3, although the water bed mattress of FIG. 5 utilizes a strip heater for generating the heat which is ultimately transferred to the water in the water chamber 16 through heat conductivity.

FIG. 6 illustrates a fragmentary vertical sectional view, somewhat similar to FIG. 5, and illustrating another modified form of water bed mattress in accordance with the present invention and which is similar to the water bed mattress of FIG. 3. In this case, the water bed mattress illustrated in FIG. 6 includes the heat generating chamber 30 which is provided with a sprayed metal resistive heater 60. In this case, the sprayed metal resistive heater 60 includes a substrate with an electrically conductive sprayed metal deposited thereon. An electrical conductor 62 is connected to the sprayed metal on the substrate forming part of the heater 60 and which electrical conductor 62 extends outwardly through the peripheral wall 14 for ultimate connection to a source of electrical energy, in a manner as hereinafter described. In this respect, it should be observed that the heat generating mechanism in the water bed mattress of FIG. 6 and, similarly, the heat generating mechanism in the water bed mattress of FIG. 5, operate in the same manner as the heating generating mechanisms in the water bed mattresses of FIGS. 3 and 4.

FIG. 7 represents another modified form of water bed mattress which is similar to that of FIG. 6, except that in this case the sprayed metal resistive heater 60 utilized in FIG. 6 is, in this case, secured to the underside of the upper sheet 10, whereas in the water bed mattress of FIG. 6, the resistive heater 60 was secured to the upper surface of the chamber forming strip 20. In either case, it can be observed that the heat generated through the electrically resistive sprayed metal resistive heater strip 60 can be conducted to the water contained within the water chamber 16. Moreover, the heater strip 60 is also provided with an electrical conductor 62 for ultimate connection to a source of electrical power.

FIG. 8 illustrates a fragmentary vertical sectional view of another modified form of water bed mattress B, which is constructed in accordance with and embodies the present invention. In this case, the water bed mattress B also includes the top sheet 10 and the bottom sheet 12 which are connected by the peripherally extending side wall 14 to form the water chamber 16. The water bed mattress of FIG. 8 also includes the chamber forming strip 20 which forms the electrical heating chamber 30, and in this case also includes the downwardly struck flange 26 which is heat sealed to the peripheral side wall 14 by means of the heat seal 28. However, and in this case, the water bed mattress B of FIG. 8 includes a flexible plastic intermediate sheet 64 which is located within the interior portion of the mattress and connected to side wall 14 and the lower sheet 12, as hereinafter described. The intermediate sheet 64 is integrally provided with a somewhat inclined, peripherally surrounding inner wall 65 which extends diagonally inwardly and downwardly from an area near the top sheet 10 and is secured to the bottom sheet 12 by means of a peripherally extending flange 66 and which is heat sealed thereto by means of a peripheral heat seal 68. Moreover, the inner peripheral wall 64 includes an arcuately shaped section 70 at its upper end which is provided with a flange 72, which is, in turn, heat-sealed to the flange 26 at the heat seal 28. In this way, the inner peripheral wall 64 forms the water chamber 16 and a surrounding lower air chamber 74. Nevertheless, the air chamber 74 surrounds the water chamber 16 and provides support thereto, except that an individual lying on the top sheet 10 is supported entirely by the water chamber 16.

In this case, the water chamber 16 is heated through a heating mechanism 76 included within the heat-generating chamber 30. The heat generating mechanism 76 is in the same form as the heater included within the chamber 30 in FIG. 3 of the drawings, and is also provided with an outwardly extending electrically conductive cable 78 for ultimate connection to a source of electrical power. Nevertheless, it can be observed that the water within the water chamber 16 is heated to a temperature which is compatible to an individual lying on the top sheet 10 and is furthermore supported peripherally by the air chamber 74, in the manner as illustrated in FIG. 8 of the drawings.

It can be observed in connection with each of the aforementioned water bed constructions that the chamber-forming strip 20 forms the heat-generating chamber 30 which contains the heat-generating mechanism. This heat generating mechanism, as mentioned, genereates the heat for conductivity through the chamber-forming strip 20 to the water contained within the water chamber 16. In this case, it can be observed that each of the heater mechanisms do not generate large amounts of heat over a unit period of time. The amount of heat generated is that normally necessary to raise the heat by a few degrees. Consequently, as in all water bed constructions, it may take a period of 24 hours, and even more, in order to raise the temperature of the water in a water chamber from the approximate 70° F ambient temperature to a temperature within the range of 90° F or slightly higher. Accordingly, it can be observed that each of the heaters utilized in the present invention do not generate excessive amounts of heat. Moreover, inasmuch as the heaters are in contact with the chamber-forming strip 20, the heat generated therefrom can be conductively applied to the water within the chamber 16.

Since the chamber-forming strip 20 is located in contact with the water, the water itself serves as a heat-sink which removes the heat immediately from the chamber-forming strip 20 and distributes the heat conductively through the water so that the water itself is essentially at the same water temperature at all times within the entire volume of the water chamber. In this way, the chamber-forming strip 20, and for that matter, the portions of the water bed mattress surrounding the chamber-forming strip 20, are not excessively heated.

In the same respect, it should also be observed that the chamber forming strip 20 could be formed of plastic materials other than the materials used in the formation of the water bed mattress and which are more capable of resisting fatigue by heat. In addition, the chamber-forming strip 20 could be formed with plasticizers of the type which do not suffer deleterious effects from the heat generated by the heating mechanism. In this respect, several known forms of plastic materials which are nevertheless flexible and foldable are also capable of resistance to heat. While such forms of plastics may be more expensive than a typical vinyl plastic used in the formation of the water bed, it can be observed that the chamber-forming strip 20 only covers a small surface area of the total water bed, and, therefore, the amount of this more expensive plastic material is relatively small.

It can also be observed in connection with any water bed mattress that the greatest heat loss from the water bed mattress is that portion of the mattress which is exposed to the external environment, such as the upper sheet 10, the lower sheet 12 and the peripheral side wall 14. Generally, the lower sheet 12 is disposed on a support frame or, otherwise, on the floor, and therefore very little heat loss occurs through the bottom sheet 12. However, considerable heat loss can occur through the peripheral side wall 14 and through the top sheet 10. It can also be observed that inasmuch as a large percentage of the heat loss occurs through the peripheral side wall and the top sheet 10, heat concentration, at least for a limited period of time, is located within the inner portion of the water contained within the water chamber 16. Accordingly, it has been found that it is only necessary to apply heat in a peripheral area surrounding the periphery of the water chamber. Thus, the heat generating chamber 30 is designed to only surround a peripheral portion of the water chamber. Inasmuch as heat loss occurs through the peripheral side wall 14 to a large extent, the heat generated by the heat generating mechanism is applied to the water and, hence, the water can be maintained at a more uniform temperature. Thus, it has been found that it is not necessary to apply heat across one entire surface area of the water bed mattress which has been deemed necessary in previous heating constructions for water bed mattresses.

FIG. 9 illustrates, in schematic form, the technique for controlling the heat applied to the water within the water chamber 16 in the water mattresses of the present invention. In this respect, it can be observed that the water bed mattress A includes the top wall 10, the bottom wall 12 and the peripheral side wall 14 which forms the interior water chamber 16. Moreover, the heat generating chamber 30 is illustrated with the heat generating mechanism 34. In this case, the heat generating mechanism 34 is illustrated in electrically schematic resistive form so as to embody those heat generating mechanisms illustrated in FIGS. 3, 5 or 6 of the drawings. In either case, the heat generating mechanism operates in the same manner so as to apply heat to the water contained within the water chamber 16.

It can be observed that the electrical conductor 36 is connected to a temperature regulator 80, which may adopt the form of a rheostat or other form of voltage control device which controls power to the heating coil 34 or, otherwise, the other forms of heating coils 56 or 60, as illustrated in FIGS. 5 and 6 of the drawings. The temperature regulator 80 is connected through the feedback controller 82 which is capable of measuring an electrical current based on temperature generated by the temperature sensor 84. In this respect, the temperature sensor 84 could adopt the form of a thermo-couple which is included in the water chamber 16 and is connected through the peripheral side wall 14 to the controller 82. In the same respect, the controller 82 would be connected to a source of conventional electrical power through electrical conductors 86.

In accordance with the above construction, the water contained within the water chamber 16 is carefully controlled within fairly precise limits by means of the feedback controller 82. Thus, when the temperature of the water within the chamber 16 is sensed by the temperature sensor 84, the feedback controller 82 will control the amount of power delivered through the temperature regulating device 80 to the heating coil 34. Thus, it can be observed that the amount of power applied to the coil 34 and which, in turn, generates the amount of heat introduced into the water contained within the chamber 16 is controlled through a closed-loop system so that the temperature of the water within the chamber 16 is carefully controlled within precise limits. However, as it can be observed in the prior art mechanisms, there was no feedback controller or heat control mechanism which carefully regulated the temperature of the water within the chamber 16. In any event, any of the water bed mattresses described in FIGS. 1-8, as well as the other water bed mattresses described hereinafter, can be controlled in the same manner by the technique illustrated in FIG. 9 of the drawings.

It can be observed that the temperature of the water contained within the water chamber 16 can be very precisely controlled by means of setting the temperature regulator 80 to a desired position. In this case, if the temperature sensor 84 detects a temperature which is too high, or otherwise too low, the feedback current to the controller will, in turn, adjust the amount of current which is ultimately supplied to the heating coil 34. In this way, the heating coil 34 will be energized or de-energized in order to provide the proper amount of heat to the water contained within the water chamber 16. Inasmuch as the water is highly conductive with respect to heat, the temperature of the water within the water chamber 16 is essentially uniform across the entire volume thereof.

FIG. 10 illustrates another modified form of water bed mattress constructed in accordance with and embodying the present invention, and which is designated by reference numeral C. In this case, the water bed mattress construction of FIG. 10 comprises the upper sheet 10 along with the bottom sheet 12 which are connected by a peripherally extending side wall 14 which thereby forms the interior water chamber 16. Moreover, the water bed mattress construction C includes the chamber forming strip 20 which forms the internal heat generating chamber 30. As indicated previously, a heater mechanism, such as a heater mechanism 34, is included within the heat-generating chamber 30 and is ultimately connected to a source of electrical power by means of an electrical conductor 36. In this case, the water bed mattress which includes the bottom wall 12 and the peripheral side wall 14 is included within a rectangularly shaped frame 90 including a peripherally extending side wall 92 and a bottom wall 94.

In one of the preferred aspects of the present invention, the water bed mattress which includes the top wall 10, the bottom wall 12 and the peripheral side wall 14 is secured to the frame 90 generally by bonding. Thus, the peripheral side wall 14 is physically secured to the peripheral frame wall 92 and the bottom wall 12 is secured to the bottom wall section 94, in the manner as illustrated in FIG. 10 of the drawings. In this latter construction, it can be observed that the frame 90 is an actual part of the water bed and, in this case, is rigid in its construction and is also relatively water impervious in its connection. Thus, in the event of any water leakage within the water bed mattress from the chamber 16, the frame 90 would retain such water so that it would not otherwise be expelled to any surrounding surface which supported the water bed C.

One of the unique aspects of the water bed C is that this water bed includes a heat retentive surface covering 96 on the upper sheet 10. In this case, the heat retentive layer 96 serves as a black body radiation covering which typically includes a lower black, or otherwise opaque, surface as well as a transparent surface disposed thereon. In accordance with this technique, heat radiation which may be introduced through the radiation covering 96 can be transferred to the water contained within the chamber 16 through the top sheet 10, although heat is effectively prohibited from leaving the water within the chamber 16 in accordance with the black body radiation technique. Thus, it can be observed that the covering 96 serves as a flat plate collector. In this way, heat which is introduced into the water contained within the water chamber 16 is retentively held therein by means of a frame 90, as well as the heat protective covering 96 on top of the sheet 10. It should be observed that the water bed mattress C, as illustrated in FIG. 10, is operable with the heating means 34 included within the heat-generating chamber 30. Any form of heating the water within the chamber 16 could be utilized so that the protective covering 96 retains the heat within the water in the chamber 16.

FIG. 11 illustrates a similar version of a water bed mattress, similar to the water bed mattress C, illustrated in FIG. 10. In this case, the water bed mattress of FIG. 11 employs a relatively thick heat insulative top cover designated by reference numeral 98 which fits over the upper sheet 10 and completely encloses the upper sheet 10 along with the frame 90. In one form of the invention, the heat insulative sheet 98 could adopt the form of a urethane foam or like material. In this respect, it is important that the insulative sheet 98 be fairly flexible in its construction. Moreover, it should be observed that while the sheet 98 is heat insulative in nature, it can be somewhat thick, as illustrated, and it nevertheless does not impair the advantages afforded by sleeping on a water bed mattress. It should also be observed, in accordance with FIG. 11, that the water bed mattress could be provided with the heater 34, or any of the other heat generating mechanisms as heretofore described, and which are included within the chamber 30.

FIG. 12 illustrates another modified form of water bed construction designated by reference letter D and which may also be utilized in accordance with the present invention. In this case, the water bed mattress D includes a rigid frame 100 having a relatively flat bottom wall 102 and a peripherally extending side wall 104, which forms an interior water chamber 106, the latter illustrated as being filled with water. In this case, a flexible foldable plastic sheet 108, preferably formed of vinyl material, is disposed over the top of the frame 100 and completely covers the peripheral top surface of the frame 100. Moreover, the top sheet 108 includes an integrally formed, peripherally extending downwardly struck flange 110 which is secured within a recess formed within the frame 100 and retained therein by means of a continuous belt 112, which may be formed of a plastic material. In this respect, it should be observed that the top sheet 108 could also be secured to the upper surfaces of the peripheral side wall 104 by means of adhesive or the like. The top sheet 108 is also preferably provided with a valve means 114 to permit the introduction and removal of water therefrom. While the valve 114 is located on the top sheet 108 as shown, it should be observed that the valve 114 could be located on the frame 100, if desired.

In this respect, it can be observed that while the water bed mattress D does include a rigid frame, the top sheet does not have to be secured thereto until time of use. In this way, the frame 100 could also be constructed so that a whole series of these frames are nestable in each other for purposes of delivery. At the point of delivery, the top sheets 108 can be secured thereto in the manner as described. In addition, it can be observed that this form of water bed mattress construction completely overcomes the potential problems of water leakage which is presently a problem in many of the commercially available water bed mattresses. If desired, the water bed mattress D could include the heat generating strip 20 which forms the heat generating chamber 30 and which includes the heat generating means 34, or otherwise some of the other heat generating mechanisms taught in the instant application.

FIG. 13 illustrates another form of water bed mattress which also includes a rigid frame, somewhat similar to the frame 90. Disposed within the recess of the frame 90 is a liner 116 which is also formed of a flexible, foldable plastic material, and which is preferably formed of polyvinylchloride. In this case, the liner 116 is constructed so that it internally includes a heater 118. In this case, the heater 118 will preferably adopt the form of a strip heater, although any of a number of conventional heating elements could be utilized. In any case, the strip heater 118 is provided with a conductor 120 for ultimate connection to a source of electrical power. Disposed within the frame 90 and located in contact with the liner 116 is a water bed mattress similar to the mattress A such that the peripheral side wall 14 is located within and in contact with the vertically disposed portion of the liner and the bottom wall 12 is located in contact with the bottom portion of the liner. It should also be observed in connection with this construction that the liner could actually be adhesively, or otherwise sealed to the water bed such as by means of heat sealing and, in turn, the liner 116 could be secured to the frame 90.

FIG. 14 illustrates a fragmentary vertical sectional view of a water bed construction similar to that of FIG. 13, and, in this case, includes the frame 90. However, the water bed construction of FIG. 14 does not include the liner. In this case, an insulated heater mechanism 122 is included within a groove 124 formed within the frame 90. Thereafter, a water bed mattress similar to the water bed mattress A is disposed within the groove formed by the frame 90. Nevertheless, the water bed mattress could also be secured to the frame 90 in the same manner as indicated in connection with the water bed mattress of FIG. 13. In any event, the heater 122 is provided with an outwardly extending electrical conductor 126 which is ultimately connected to a source of electrical power. The heater 122 is again preferably a strip heater, although any form of heater mechanism in accordance with the present invention could also be utilized.

FIG. 15 illustrates another modified form of water bed mattress construction E and which includes a frame 128 somewhat similar to the frame 90, but which in this case is hollow in its construction and may also be provided with an interior heat insulative material 131 in the central chamber 130 thereof. In this case, a water bed mattress, similar to the mattress A, is disposed within the frame 128 and includes the top wall 10 and the bottom wall 12 connected by the peripheral side wall 14. Moreover, this water bed mattress includes the heat generating chamber 30 which is provided with the electrical heating element 34.

FIG. 16 also provides a water bed construction similar to the water bed construction of FIG. 15. However, in this case, a heater element 132 is included within a liner 134 surrounding the water bed mattress, much in the same manner as in the construction of FIG. 13, and is also provided with an electrical conductor 136 for ultimate connection to a source of electrical power.

In any of the embodiments of FIGS. 1-16, it should also be observed that the feedback control system illustrated in FIG. 9 could also be employed. Thus, in this way, each of the water bed mattress constructions of the present invention are all self-regulating and avoid the problems of burn-out due to poor insulation, or vinyl foldover, and thereby elevate the liability of the product to produce a safe water bed system.

In accordance with the present invention, it can be observed that each of the water beds can be provided with heating systems which are essentially self-regulating, and therefore carefully control temperature of the water within the water chamber. Moreover, as a result of this careful heat regulating control, the efficiency of the water bed is improved and comfort to the user thereof is greatly increased. Moreover, due to the various constructions herein, heat losses are substantially reduced which thereby eliminates energy consumption. One of the unique aspects of the present invention is that temperature measurement through vinyl material is fairly inaccurate, whereas in prior art systems, the set temperature can differ from the actual water temperature by as much as five degrees. In accordance with the closed loop temperature systems of the present invention, this variance is drastically reduced and, hence, the heating systems which are integrated with the water beds of the present invention are more highly efficient.

FIGS. 17–27 illustrate the various method steps in constructing several of the water bed mattress constructions of the present invention. However, the method of making the water bed construction will be described in connection with the water bed mattress A of FIGS. 1–3 of the drawings. Nevertheless, it should be understood that this method of making the water bed mattress construction is applicable to most of the other embodiments of the water bed constructions taught herein.

In accordance with the producing of the water bed mattress A of the present invention, an initial sheet of flexible foldable plastic material, and designated by reference numeral 150, is unrolled from a roll 152 and laid on a flat surface. Moreover, FIG. 17 has been illustrated with phantom lines to show an upper sheet 10, along with the lower sheet 12, and one portion of a transverse side wall 154 which forms part of the peripheral side wall 14. In addition, the sheet 150 is illustrated as having two end flaps 156 and 158, the end flap 156 being integral with the upper sheet 10 and the end flap 158 being integral with the lower sheet 12.

In accordance with the next step in the making of the water bed mattress A, a first aperture 160 is formed in the end flap 156 and located in close proximity to the edge of the upper sheet 10. This aperture 160 is designed to receive the outwardly extending electrical conductor 36 forming part of the heat generating mechanism 34. In addition, another aperture 162 is formed in the end flap 154 and is designed to receive a conductor connected to the sensor 84. These apertures 160 and 162 may be formed in any conventional manner, as for example, by punching or the like.

FIG. 18 illustrates the next step in the making of the water bed mattress construction A, and, in this case, a heat generating mechanism is secured to the upwardly presented surface of that portion of the sheet 150 which constitutes the upper sheet 10 and is located in close proximity to the margin of attachment of the end flap 156. Again, the heat generating mechanism is comprised of the support strip 32 and a heating element 34, although the element 34 is illustrated in connection with the method as being in the form of an electrical resistance strip. The support strip 32 can be secured to the upper surface of that portion of the initial sheet 150 which constitutes the upper sheet 10 by any conventional technique, such as heat sealing, adhesives, or the like. In like manner, and by reference to FIG. 18, it can be observed that the sensor 84 is also secured to the upwardly presented surface of the end flap 154 and is provided with an electrically conductive cable extending through the aperture 162.

FIG. 19 illustrates the use of the chamber-forming strip 20, along with the horizontally disposed flange 22 and the material which will constitute the downwardly struck flange 26, and which is, in this case, shown as being initially horizontal. It can also be observed by reference to FIG. 19 that the electrical conductor 36 is introduced into the aperture 160 and extends outwardly from the flap 156 which ultimately forms part of the peripheral side wall 14. By reference to FIG. 9, it can be observed that the electrically conductive cables are connected to the controller 82.

Referring now to FIG. 20, it can also be observed that the chamber-forming strip 20 is heat sealed to the initial sheet 150 such that the horizontal flange 22 is secured to that portion of the sheet 150 constituting the upper sheet 10 by means of heat seal 24 and the downwardly struck flange 26 is secured to the flap 156 by means of the heat seal 28. In this way, it can be observed that the chamber-forming strip 20 forms the interior chamber 30 with the heater 34 disposed therein. The electrical conductor 36 which passes through the aperture 160 could be sealed within the aperture 160 by any conventional sealing. Thus, after the conductor 36 is passed through the aperture 160, various heat sealing compounds, such as epoxies or the like, could be injected into the aperture to form a complete seal. Moreover, a plastic grommet or the like could also be used in order to effect this seal. In addition, the conductor which is connected to the sensor 84 could be sealed in like manner.

FIG. 21 illustrates the main initial plastic sheet 150 being folded over to form the upper sheet 10 with the heater mechanism 34 secured thereto and enclosed within the heat generating chamber 30. In this case, it can be observed that the side wall segment 154 now forms a transverse end portion of the peripheral side wall 14. Moreover, it can be observed that the flap 156 on the upper sheet 10 is struck downwardly and the flap 158 on the lower sheet 12 is also struck upwardly and heat-sealed in a manner to be hereinafter described.

FIG. 22 illustrates a slightly modified form of making the water bed mattress in accordance with the present invention. In this case, the heater 34 is secured to the chamber forming strip 20 by means of either heat sealing or otherwise adhesively securing the support strip 32 to the upwardly presented surface of the chamber-forming strip 20. Referring to FIG. 23, it can also be observed that the chamber-forming strip is inverted so that the heater 34 is presented toward the face of the upper sheet 10. The flanges 22 and 26 are also bent on the chamber-forming strip 20. In addition, the electrical conductor 36 is inserted through the aperture 160. By referring to FIG. 24, it can be observed that the flanges 22 and 26 are secured to the upper sheet 10 and the peripheral side wall 14 by means of the respective heat seals 24 and 28 and thereby forming the heat generating chamber 30. In this case, it can therefore be observed that the heater 34 is located on the interior surface of the chamber-forming strip.

FIG. 25 illustrates the sealing of the two end flaps 156 and 158 by means of a heat seal 166. In this case, it can be observed that the heater 34 is located on the chamber-forming strip 20, although in accordance with the present invention it could be located on the upper sheet 10, as illustrated in FIG. 21. Moreover, it can be observed that when the two end flaps 156 and 158 are heat sealed together, by means of the heat seal 166, that another transverse end wall forming part of the peripheral side wall 14 is formed.

FIG. 26 illustrates longitudinal side flaps, such as a flap 162, integral with the upper sheet 10 and a longitudinal flap 164 integral with the lower sheet 12. These two flaps are bent over in the manner as illustrated in FIG. 27, and thereafter heat sealed by means of a longitudinal heat seal 168, in the manner as illustrated in FIG. 27. In this way, the entire water bed mattress is completely formed so as to form the water chamber 16. In addition, it should be observed that two additional longitudinal side flaps 162 and 164 would be located on the opposite side of the water bed mattress and would also be heat sealed by means of the heat seal 168.

FIG. 28 illustrates a further form of water bed mattress constructed in accordance with and embodying the present invention and which includes a top wall 170 and a bottom wall 172 connected to a peripherally extending side wall 174 to form an interior water chamber 176. In this case, a chamber-forming strip 178 includes an upper flange 180 secured to the peripheral side wall 174 and a lower flange 182 secured to the bottom wall 172 to form a heat generating chamber 184. The respective flanges 180 and 182 are sealed to the respective peripheral side wall and the bottom wall 172 by means of heat seals 186 and 188. Secured to the interior surface of the peripheral side wall 174 is a substrate 190 which also contains a heater mechanism (not shown) and which is connected through a conductor 192 extending exteriorly of the water bed mattress.

FIG. 29 shows a water bed mattress construction similar to the water bed mattress construction of FIG. 28. However, in this case, the substrate 190 containing the heater element is secured to the surface of the chamber-forming strip 178 as opposed to the interior side wall 174. Otherwise, the water bed construction of FIG. 29 is similar to the water bed construction of FIG. 28 and operates in a similar manner. It should also be observed that the heater mechanism contained within or on the substrate 190 can extend peripherally around the entire surface of the water bed mattress or could be included in segmental portions thereof. In any event, it can also be observed that the heat generated within the heat generating chamber 184 is capable of providing heat to the water contained within the water chamber 176 in either of these configurations.

FIG. 30 illustrates a further modified form of water bed mattress constructed in accordance with the present invention and which includes a rigid frame 194 which holds a water bed mattress 196. The mattress comprises a top wall 198, a bottom wall 200 and a peripherally extending size wall 202, thereby forming an interior water chamber 204. In this case, a pad of the type normally disposed on water bed mattresses, and designated by reference numeral 206, is disposed on the upper surface of the upper sheet 198. The pad 206 further includes a heating element designated as 208, along with a conductor 210 extending outwardly thereof which is connected to a suitable source of electrical current. In this case, the pad is generally covered by a mattress sheet or cover or similar form of covering mechanism. Nevertheless, by means of the pad being disposed on the upper surface of the water bed mattress, the pad is capable of generating the necessary heat and applying the same to the interior surface of the water bed mattress, namely the water contained within the chamber 204. In this respect, it can be observed that the pad does not suffer from permanent folding which would generate localized heat spots, and is therefore highly effective in accordance with the present invention.

FIG. 31 illustrates a foil heating element 212 which comprises a substrate 214 generally of a flexible plastic material and containing aluminum foil resistive heating strips 216. The foil heating strips 216 generally comprise an enlarged terminal head 218 which may be provided with an electrical conductor 220 for connection to a suitable source of electrical current. In this case, each of the conductors 220 would be commonly joined prior to connection to the source of electrical current. In addition, a common conductive strip (not shown) could connect each of the enlarged heads 218. Each of the enlarged head portions 218 are provided with longitudinally extending resistive strip legs 222, in the manner as illustrated in FIG. 31 and FIG. 32 of the drawings. These electrically resistive strips are designed to generate heat upon the application of electrical current thereto.

In this case, the heating strips 216 may be secured to the plastic substrate 214 which can, in turn, be secured to a suitable portion of the water bed mattress or an element related to the water bed mattress as previously described. Otherwise, in many cases, the aluminum foil conductive strips 216 are designed for removal from the substrate 214 and for application to the vinyl film forming part of the water bed mattress. FIG. 32 illustrates the aluminum foil strips 216 as being attached directly to a vinyl substrate 224, forming part of the components of the water bed mattress by means of a suitable adhesive designated as 226. As indicated above, the adhesive may not necessarily be employed, and the aluminum strips could be laminated directly to the vinyl material forming part of the water bed mattress.

FIG. 33 represents an alternate form of heater strip arrangement 228 on a substrate 230. In this case, individual conductive strips 232 are connected by means of a conductive peripheral margin 234 and individual intermediate conductive strips 236 which are perpendicular to the heating conductive strips 232.

FIG. 34 represents yet another modified form of heating mechanism which comprises a substrate 238 and a plurality of parallel conductive strips 240. A peripheral conductive strip 242 extends around the substrate 238 and is connected to certain of the conductive strips 240. In addition, thin wire leads 244 connect intermediate ones of the parallel conductive strips 240 and in such arrangement that all of the conductive strips are interconnected. In accordance with this arrangement, any one of the conductive strips could be broken and destroy contact with the remaining portion, but which would nevertheless not interfere with the operation of the heating element.

The water bed mattress heating devices which have been described immediately above utilize heating elements which are offered by Kanthal-Eisler under the trade name "KEF-Foil Heating Elements". In addition, such heating elements are offered by Hall & Pickles. These heating elements which have been designed particularly for other purposes have been found to be highly effective for use in water bed mattress heating constructions. The metal foil strips utilized in these heating devices can be mechanically processed with respect to water bed mattresses to create electrically conducting meander patterns parallel across its width. Moreover, the foils can be crimped transversely before being laminated in order to ensure that stresses are not transmitted to the foil itself. In this respect, it should be observed that various patterns could be utilized in connection with the present invention, and FIGS. 31–34 illustrate only preferred embodiments thereof.

The completed heating element can consist of one or several circuits, depending upon the surface area to be utilized in the water bed mattress, the temperature to be achieved and the available voltages. In addition to aluminum foils, nickel foils, cupro-nickel foils and the like may also be utilized. With respect to adhesively securing these foils to the vinyl sheets forming part of the present invention, or to a substrate which is in turn adhered to the vinyl sheets, the adhesives may be pressure sensitive adhesives, emulsions, hot-melts, silicons, sodium silicate or the like. Again, the backing material may be of any suitable plastic, such as polyvinylchloride, polyethylene, asbestos paper, non-woven tissues and the like.

Each of the heating elements has been found to be highly effective inasmuch as they are flexible and able to follow complex contours and to allowable flexure in service as is required in water bed mattresses. In addition, these heating elements are specially designed so that they eliminate hot and cold spots over the large areas required in heating the water in a water bed mattress. An important factor with respect to these heating elements is that they can operate from low-voltage sources and can be adaptable with respect to backing materials for securement to portions of the water bed mattress. Moreover, particularly, these foils have been found to be highly effective in that they do not create localized hot spots.

It has been found in connection with the present invention that the aluminum used in the resistive heating strips should have a resistivity of about 0.04 ohms per square millimeter at 20° C, and a temperature factor resistance of 0.003° C within a temperature range of about zero to about 200° C. Thus, the most preferred foil thicknesses which are employed in the present invention are between about 0.025 and 0.05 millimeters, although other thicknesses may be selected, but the lower limit for the aluminum foil thickness is about 0.01 millimeters.

Thus, there has been illustrated and described various forms of novel water bed constructions which can be made at relatively low unit cost and which include both unique heating means and means for reducing temperature loss therefrom and the method of making such constructions. Consequently, the water bed constructions and methods described herein fulfill all of the objects and advantages sought therefor. Many changes, modifications, variations, and other uses and applications of the water bed constructions and the methods of making the same of the present invention will become apparent to those skilled in the art after considering this specification and the accompanying drawings. Therefore, all such changes, modifications, variations and other uses and applications which do not depart from the spirit and scope of the invention are deemed to be covered by the invention which is limited only by the following claims.

Having thus described my invention, what I desire to claim and secure by letters patent is:

1. A water bed mattress with regulated heating means therefor, said water bed mattress comprising:
   (a) an upper and a lower sheet surrounded by a peripheral wall to form a water chamber therebetween, said upper and lower sheets and peripheral wall being formed of a foldable flexible plastic material,
   (b) panel means formed of an electrically insulative heat conductive foldable flexible plastic material and being heat sealed to one or more of said upper and lower sheets and peripheral wall and forming a substantially completely enclosed heat generating chamber formed by said one of said sheets and said panel means,
   (c) an electrically energizable heating means located within said heat generating chamber and capable of generating heat conductively passed through said upper or lower sheets or peripheral wall to water in said water chamber,
   (d) connector means operatively provided for connection of said heating means outwardly of said heat generating chamber to a source of electrical power, and
   (e) control means operatively associated with said connector means for regulating the heat supplied by said heating means.

2. The water bed mattress of claim 1 further characterized in that said control means comprises a temperature setting means for setting a desired temperature of water in said water chamber, sensing means located in said water chamber for sensing the temperature of water in said water chamber, and controller means interposed between said temperature setting means and sensing means to create a closed circuit loop therebetween to automatically regulate the amount of heat applied to the water in accordance with the temperature set on the temperature setting means.

3. The water bed mattress of claim 2 further characterized in that said controller means is provided with electrical conductors for connection to a source of electrical energy.

4. The water bed mattress of claim 1 further characterized in that said heat generating chamber extends around a peripheral portion of either said upper sheet or said lower sheet with which said panel means is sealed.

5. The water bed mattress of claim 2 further characterized in that said heat generating means is a coil heater.

6. The water bed mattress of claim 2 further characterized in that said heat generating means is a strip heater.

7. The water bed mattress of claim 1 further characterized in that said heat generating means is a heater element which is located in proximity to said lower sheet and that said panel means is located in proximity to said lower sheet.

8. A water bed mattress construction with integral insulative heat means therefor, said water bed mattress construction comprising:
   (a) an upper and a lower sheet surrounded by a peripheral wall to form a water chamber therebetween,
   (b) a relatively rigid frame member surrounding the lower sheet and the peripheral wall, and providing heat insulative qualities to aid in the prevention of heat loss from water in said water chamber, and
   (c) a heat insulative member disposed across said upper sheet and being rigidly secured thereto so as to enclose said water chamber within said frame member, said heat insulative member effectively serving as a flat plate collector operating through black body radiation to permit passage of heat through the heat insulative member and into the water chamber but to prevent heat from passing back through the heat insulative member to aid in the prevention of heat loss from water in said water chamber.

9. The water bed mattress construction of claim 8 further characterized in that said water bed mattress construction comprises:
   (a) sealing means formed of an electrically insulative heat conductive material and forming a substantially completely enclosed heat generating chamber with said upper sheet,
   (b) an electrically energizable heating means located within said heat generating chamber and capable of generating heat conductively passed through said sealing means to water in said water chamber,
   (c) connector means operatively provided for connection of said heating means outwardly of said heat generating chamber to a source of electrical power, and
   (d) control means operatively associated with said connector means for regulating the heat supplied by said heating means.

10. The water bed mattress construction of claim 9 further characterized in that said control means comprises a temperature setting means for setting a desired temperature of water in said water chamber, sensing means for sensing the temperature of water in said water chamber, and controller means interposed between said temperature setting means and sensing means to create a closed circuit loop therebetween to automatically regulate the amount of heat applied to the water in accordance with the temperature set on the temperature setting means.

11. A water bed mattress construction with integral heat insulative means therefor, said water bed mattress construction comprising:
   (a) a relatively rigid frame having a rigid base member and a rigid peripheral upstanding side wall,
   (b) said rigid peripheral side wall presenting a peripherally extending top surface,
   (c) a flexible foldable plastic upper sheet disposed across said top surface and forming with said rigid frame an interior water chamber,
   (d) valve means forming part of said mattress construction to permit introduction and removal of water from said interior water chamber, and
   (e) means for rigidly securing said upper sheet to said frame so that a party lying on said upper sheet is supported by said upper sheet and the water in said interior chamber.

12. The water bed mattress construction of claim 11 further characterized in that said upper sheet is provided with a peripherally extending downwardly struck portion which is secured to said rigid peripheral side wall by at least mechanical means.

13. The water bed mattress construction of claim 11 further characterized in that a heat insulative member is disposed across said upper sheet and is rigidly secured thereto so as to enclose said water chamber within said frame member and to aid in the prevention of heat loss from water in said water chamber.

14. A water bed mattress construction with regulated heating means therefor, said water bed mattress construction comprising:

(a) an upper and lower flexible sheet surrounded by a peripheral wall of flexible material to form a water chamber therebetween,
(b) a relatively rigid frame having a rigid base wall and an upstanding peripheral rigid side wall surrounding the lower sheet and the peripheral wall of said sheet and providing heat insulative qualities to aid in the prevention of heat loss from water in said water chamber,
(c) means forming an area between at least a portion of said frame and said lower sheet and peripheral wall of said flexible material to receive a heating means,
(d) an electrically energizable heating means disposed in said area and extending around at least a portion of the peripheral wall of flexible material and being in contact therewith, said heating means being completely isolated from the external environment, said heating means also being located in relation to said water chamber to apply heat to the water in said water chamber,
(e) connector means operatively providing for connection of said heating means outwardly of said area to a source of electrical power, and
(f) control means operatively associated with said connector means for regulating the heat supplied by said heating means.

15. The water bed mattress construction of claim 14 further characterized in that said frame is provided with a hollow portion to serve as a heat insulative chamber.

16. The water bed mattress construction of claim 15 further characterized in that a heat insulating material is included in said hollow portion.

17. The water bed mattress construction of claim 14 further characterized in that a liner disposed between said frame and lower sheet and peripheral wall of flexible material.

18. The water bed mattress construction of claim 14 further characterized in that said control means comprises a temperature setting means for setting a desired temperature of water in said water chamber, sensing means for sensing the temperature of water in said water chamber, and controller means interposed between said temperature setting means and sensing means to create a closed circuit loop therebetween to automatically regulate the amount of heat applied to the water in accordance with the temperature set on the temperature setting means.

19. A water bed mattress with regulated heating means therefor, said water bed mattress comprising:
   (a) an upper and a lower sheet surrounded by a peripheral wall to form a water chamber therebetween,
   (b) sealing means formed of an electrically insulative heat conductive material and forming a substantially completely enclosed heat generating chamber formed by said peripheral wall and said sealing means,
   (c) an electrically energizable heating means located within said heat generating chamber and secured to said peripheral wall and capable of generating heat conductively passed through said sealing means to water in said water chamber,
   (d) Connector means operatively provided for connection of said heating means outwardly of said heat generating chamber to a source of electrical power, and (e) control means operatively associated with said connector means for regulating the heat supplied by said heating means.

20. A water bed mattress construction with regulated heating means therefor, said water bed mattress construction comprising:
 (a) an upper and a lower sheet surrounded by a peripheral wall to form a water chamber therebetween,
 (b) a mattress pad disposed on said mattress, said pad being formed of an electrically insulative heat conductive material and having a heat generating chamber therein,
 (c) an electrically energizable heating means located within said heat generating chamber and capable of generating heat conductively passed through said pad and through said upper sheet to the water in said water chamber,
 (d) connector means operatively provided for connection of said heating means outwardly of said heat generating chamber to a source of electrical power, and
 (e) control means operatively associated with said connector means for regulating the heat supplied by said heating means.

21. A water bed mattress with regulated heating means therefor, said water bed mattress comprising:
 (a) an upper and a lower sheet surrounded by a peripheral wall to form a water chamber therebetween,
 (b) sealing means formed of an electrically insulative heat conductive material and forming a substantially completely enclosed heat generating chamber formed by a portion of said mattress and said sealing means,
 (c) an electrically energizable heating means located within said heat generating chamber and capable of generating heat conductively passed through said sealing means to water in said water chamber, said heating means being comprised of a substrate forming a part of said water bed mattress, a plurality of relatively thin electrically resistive strips capable of generating heat upon application of electrical current and which occur in regularly repeated patterns, and
 (d) connector means operatively provided for connection of said heating means outwardly of said heat generating chamber to a source of electrical power.

22. A water bed mattress with regulated heating means therefor, said water bed mattress comprising:
 (a) an upper and a lower sheet surrounded by a peripheral wall to form a water chamber therebetween,
 (b) sealing means formed of an electrically insulative heat conductive material and forming a substantially completely enclosed heat generating chamber formed by said upper sheet and said sealing means,
 (c) an electrically energizable heating means located within said heat generating chamber in proximity to said upper sheet and capable of generating heat conductively passed through said sealing means to water in said water chamber,
 (d) connector means operatively provided for connection of said heating means outwardly of said heating generating chamber to a source of electrical power, and
 (e) control means operatively associated with said connector means for regulating the heat supplied by said heating means.

23. A water bed mattress with regulated heating means therefor, said water bed mattress comprising:
 (a) an upper and a lower sheet surrounded by a peripheral wall to form a water chamber therebetween,
 (b) an inclined wall forming an air chamber surrounding a periphery of said water chamber along a lower portion thereof, but where said water chamber is substantially located under the substantially entire surface area of said upper sheet,
 (c) sealing means formed of an electrically insulative heat conductive material and forming a substantially completely enclosed heat generating chamber formed by said one of said sheets and said sealing means,
 (d) an electrically energizable heating means located within said heat generating chamber and capable of generating heat conductively passed through said sealing means to water in said water chamber,
 (e) connector means operatively provided for connection of said heating means outwardly of said heat generating chamber to a source of electrical power, and
 (f) control means operatively associated with said connector means for regulating the heat supplied by said heating means.

24. A water bed mattress construction with integral insulative heat means therefor, said water bed mattress construction comprising:
 (a) an upper and a lower sheet surrounded by a peripheral wall to form a water chamber therebetween,
 (b) sealing means formed of an electrically insulative heat conductive material and forming a substantially completely enclosed heat generating chamber with said upper sheet and which extends only around a peripheral portion of said upper sheet,
 (c) an electrically energizable heating means located within said heating generating chamber and capable of generating heat conductively passed through said sealing means to water in said water chamber,
 (d) connector means operatively provided for connection of said heating means outwardly of said heating generating chamber to a source of electrical power, and
 (e) control means operatively associated with said connector means for regulating the heat supplied by said heating means,
 (f) a relatively rigid frame member surrounding the lower sheet and the peripheral wall, and providing heat insulative qualities to aid in the prevent of heat loss from water in said water chamber, and
 (g) a heat insulative member disposed across said upper sheet and being rigidly secured thereto so as to enclose said water chamber within said frame member and to aid in the prevention of heat loss from water in said water chamber.

25. A water bed mattress construction with integral heat insulative means therefor, said water bed mattress construction comprising:
 (a) a relatively rigid frame having a rigid base member and a rigid peripheral upstanding side wall,
 (b) said rigid peripheral side wall presenting a peripherally extending top surface, (c) a flexible foldable plastic upper sheet disposed across said top surface and forming with said rigid frame an interior water chamber, (d) sealing means formed of an electrically insulative heat conductive material and forming a substantially completely enclosed heat generating chamber with said upper sheet, (e) an electrically energizable heating means located within said heat generating chamber and capable of generating heat conductively passed through said sealing means to water in said water chamber, (f) connector means operatively provided for connection of said heating means outwardly of said heat generating chamber to a source of electrical power, (g) control means operatively associated with said connector means for regulating the heat supplied by said heating means, (h) valve means forming part of said mattress construction to permit introduction and removal of water from said interior water chamber, and (i) means for rigidly securing said upper sheet to said frame so that a party lying on said upper sheet is supported by said upper sheet and the water in said interior chamber.

26. The water bed mattress construction of claim 25 further characterized in that said control means comprises a temperature setting means for setting a desired temperature of water in said water chamber, sensing means for sensing the temperature of water in said water chamber, and controller means interposed between said temperature setting means and sensing means to create a closed circuit loop therebetween to automatically regulate the amount of heat applied to the water in accordance with the temperature set on the temperature setting means.

27. The water bed mattress construction of claim 25 further characterized in that a heat insulative member is disposed across said upper sheet and is rigidly secured thereto so as to enclose said water chamber within said frame member and to aid in the prevention of heat loss from water in said water chamber.

28. The water bed mattress construction of claim 25 further characterized in that said heat generating chamber extends only around a peripheral portion of said upper sheet.

29. A water bed mattress construction with regulated heating means therefor, said water bed mattress construction comprising:

(a) an upper and lower flexible sheet surrounded by a peripheral wall of flexible material to form a water chamber therebetween, (b) a relatively rigid frame having a rigid first base wall and a first upstanding peripheral rigid side wall surrounding the lower sheet and the peripheral wall of said sheet and providing heat insulative qualities to aid in the prevention of heat loss from water in said water chamber, (c) said frame having a rigid second base wall spaced from said first base wall and being of the same horizontal dimension and a second upstanding peripheral rigid side wall spaced from said first side wall and being of the same vertical dimension to thereby form a hollowing insulating space in said frame for its entire horizontal and vertical dimensions.

30. The water bed mattress construction of claim 29 further characterized in that said heating means extends around at least a portion of the peripheral wall of flexible material and is in contact therewith.

31. The water bed mattress construction of claim 29 further characterized in that a heat insulating material is included in said hollowing space.

32. The water bed mattress construction of claim 29 further characterized in that said area is a space formed between the frame and lower sheet and peripheral wall of flexible material, a liner disposed between said frame and lower sheet and peripheral wall of flexible material, and said heating means being included in said liner.

33. A water bed mattress construction with regulated heating means therefor, said water bed mattress construction comprising:

(a) an upper and lower flexible sheet surrounded by a peripheral wall of flexible material to form a water chamber therebetween, (b) a relatively rigid frame having a rigid base wall and an upstanding peripheral rigid side wall surrounding the lower sheet and the peripheral wall of said sheet and having a hollow portion therein, (c) a heat insulating material disposed in said hollow portion and providing heat insulative qualities to aid in the prevention of heat loss from water in said water chamber, (d) means forming an area between at least a portion of said frame and said lower sheet and peripheral wall of said flexible material to receive a heating means, (e) an electrically energizable heating means disposed in said area and being completely isolated from the external environment, said heating means being located in relation to said water chamber to apply heat to the water in said water chamber, (f) connector means operatively providing for connection of said heating means outwardly of said area to a source of electrical power, and (g) control means operatively associated with said connector means for regulating the heat supplied by said heating means.

34. A water bed mattress with regulated heating means therefor, said water bed mattress comprising:

(a) an upper and a lower sheet surrounded by a peripheral wall to form a water chamber therebetween, (b) sealing means formed of an electrically insulative heat conductive material and forming a substantially completelly enclosed heat generating chamber formed by a portion of said mattress and said sealing means, (c) an electrically energizable heating means located within said heat generating chamber and capable of generating heat conductively passed through said sealing means to water in said water chamber, said heating means being comprised of a substrate, said substrate being a separate element which is heat sealed to a part of said water bed mattress, a plurality of relatively thin electrically resistive strips capable of generating heat upon application of electrical current and which occur in regularly repeated patterns, and (d) connector means operatively provided for connection of said heating means outwardly of said heat generating chamber to a source of electrical power.

35. A water bed mattess with regulated heating means therefor, said water bed mattress comprising:

(a) an upper and a lower sheet surrounded by a peripheral wall to form a water chamber therebetween, (b) sealing means formed of an electrically insulative heat conductive material and forming a substantially completely enclosed heat generating chamber formed by a portion of said mattress and said sealing means, (c) an electrically energizable heating means located within said heat generating chamber and capable of generating heat conductively passed through said sealing means to water in said water chamber, said heating means being comprised of a substrate, a plurality of relatively thin electrically resistive strips capable of generating heat upon application of electrical current and which occur in regularly repeated patterns, said resistive strips having a resistivity of about 0.04 ohms per square millimeter at about 20° C, and (d) connector means operatively provided for connection of said heating means outwardly of said heat generating chamber to a source of electrical power.

36. A water bed mattress construction with regulated heating means therefor, said water bed mattress construction comprising:

(a) an upper sheet of flexible plastic material and a lower sheet of flexible plastic material surrounded by and connected by a peripherally extending wall of flexible plastic material to form a water chamber therebetween, (b) valve means on one of said sheets or said wall for opening and closing and permitting introduction of water into or removal of water from said water chamber, (c) a liner formed of flexible foldable plastic material surrounding at least said lower sheet and at least a portion of said peripherally extending wall, (d) an electrical heating element in said liner for applying heat through said lower sheet and said portion of said peripherally extending wall to the water contained within said water chamber, and (e) means for electrically connecting said electrical heating element to a source of electrical power.

37. The water bed mattress construction of claim 36 further characterized in that a relatively rigid frame having a rigid base and a rigid upstanding peripheral side wall surrounds and retains said liner and the upper and lower sheets and peripherally extending wall forming said water chamber.

* * * * *